(12) United States Patent
Runyon et al.

(10) Patent No.: US 7,537,997 B2
(45) Date of Patent: May 26, 2009

(54) ENSURING MIGRATABILITY OF CIRCUITS BY MASKING PORTIONS OF THE CIRCUITS WHILE IMPROVING PERFORMANCE OF OTHER PORTIONS OF THE CIRCUITS

(75) Inventors: Stephen L. Runyon, Pflugerville, TX (US); Scott Stiffler, Brooklyn, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/114,965

(22) Filed: May 5, 2008

(65) Prior Publication Data
US 2008/0203489 A1 Aug. 28, 2008

Related U.S. Application Data

(63) Continuation of application No. 11/207,074, filed on Aug. 18, 2005, now Pat. No. 7,378,318.

(51) Int. Cl.
*H01L 21/8234* (2006.01)
(52) U.S. Cl. .............................. 438/275; 257/E21.424; 257/E27.064
(58) Field of Classification Search ................. 438/275; 257/E21.424, E27.064
See application file for complete search history.

(56) References Cited

U.S. PATENT DOCUMENTS

| 6,621,131 | B2 | 9/2003 | Murthy et al. |
| 6,982,465 | B2 | 1/2006 | Kumagai et al. |
| 2005/0218455 | A1 | 10/2005 | Maeda et al. |
| 2006/0043591 | A1 | 3/2006 | Yim et al. |
| 2006/0183339 | A1 | 8/2006 | Ravi et al. |
| 2006/0249794 | A1* | 11/2006 | Teh et al. .................... 257/369 |

* cited by examiner

*Primary Examiner*—Trung Dang
(74) *Attorney, Agent, or Firm*—Stephen J. Walder, Jr.; Casimer K. Salys

(57) ABSTRACT

Mechanisms for ensuring the migratability of circuits into future technologies while minimizing fabrication costs and maintaining or improving power efficiency are provided. A mask layer is introduced to portions of the integrated circuit prior to a stress inducing layer being applied to the integrated circuit. In an exemplary embodiment, a tensile or compressive film is applied to the devices on the integrated circuit chip but is removed from those devices whose operation is to be modified. Thereafter, a tensile or compressive strain layer is applied to the devices whose film was removed. An additional mask layer may then be used to effect a halo or well implant to relax the strain on the devices not being protected by the mask layer. In this way, the current of the non-protected devices is reduced back to its original target design point.

10 Claims, 4 Drawing Sheets

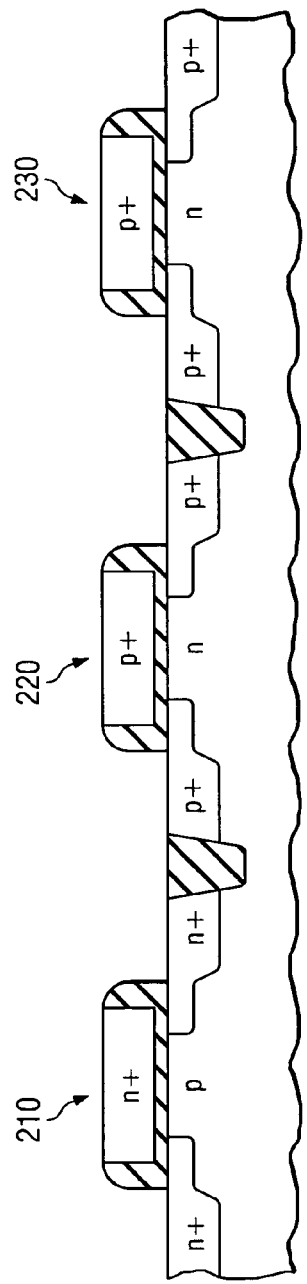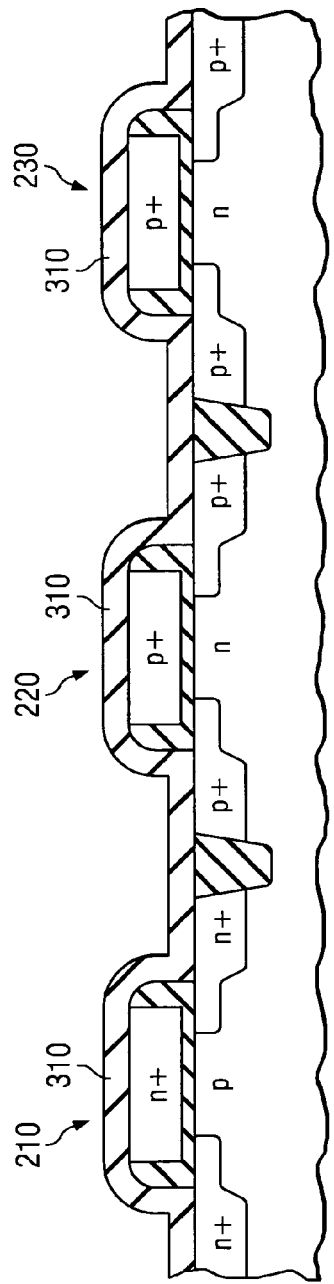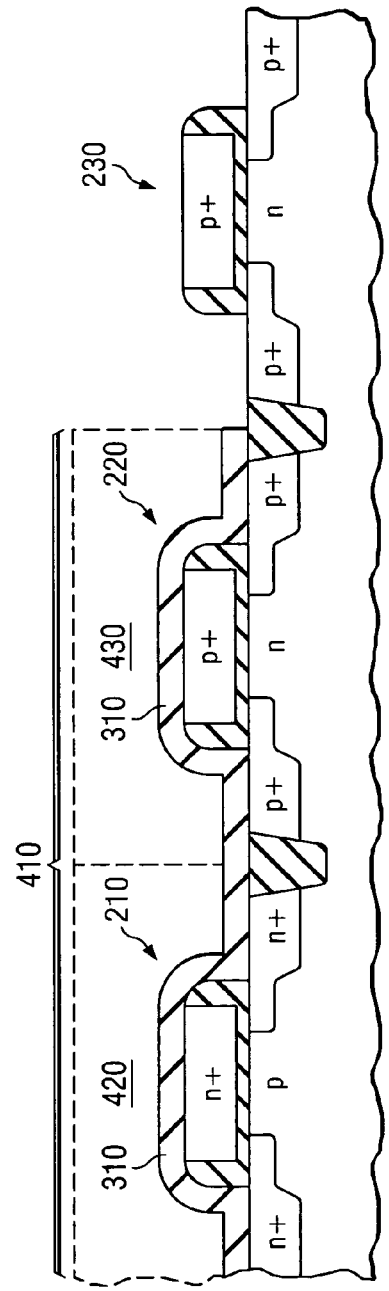

ved system and method for improving the operational character-

ENSURING MIGRATABILITY OF CIRCUITS BY MASKING PORTIONS OF THE CIRCUITS WHILE IMPROVING PERFORMANCE OF OTHER PORTIONS OF THE CIRCUITS

This application is a continuation of application Ser. No. 11/207,074, filed Aug. 18, 2005, awaiting publication.

BACKGROUND OF THE INVENTION

1. Technical Field

The present invention relates generally to an improved system and method for improving the operational characteristics of a circuit. In particular, the present invention provides a system and method for masking a portion of a circuit while performance improvements are made to other portions of the circuit so that existing circuits may be migrated to new technologies without further modification or redesign.

2. Description of Related Art

In previous semiconductor technologies, technology speed improvements within a general Very Large Scale Integrated (VLSI) circuit fabrication technology scaled well. That is, both N- and P-type transistors increased their current and switching speeds in the VLSI circuits relatively equally. While wiring usually scaled at a different rate than transistor speeds, innovations which increased the speed of either transistors or wiring generally improved the frequency of the integrated circuit designs. In particular, speeds of various types of transistors scaled nearly equally.

In the more recent past, particularly in the 90 nm technology families, improvements to transistor performance have come primarily from improvements in P-type transistor performance while N-type transistors remained roughly constant. This leads to what is called a "beta ratio" shift, i.e. a shift in the relative strength of N-type versus P-type transistors. This in turn leads to several problems.

Since the circuits on a given integrated circuit chip design were optimized for performance and yield for a target technology, they necessarily must assume a nearly constant beta ratio for the design point. Many large processor designs have person-decades or even person-centuries invested into optimizing for highest possible frequency.

For normal digital circuits, the curve of performance versus optimum P-type and N-type transistor sizes is fairly shallow. Thus, most simple digital circuits will speed up somewhat if either the N-type or P-type transistor performance improves. Even if they are not optimized for maximum frequency improvement in the new target technology, they will speed up satisfactorily without expensive design changes or redesign. In fact, gains achievable via redesign are often not economically feasible.

However, many analog and dynamic circuits are not so forgiving. In cases of beta ratio shifts, analog and dynamic circuits can actually stay the same speed or slow down, thus become the limiting factor in frequency improvement. Indeed, they often may become non-functional with beta ratio shifts, thus forcing expensive and time consuming redesign. Often they are fast enough, in the original technology, to already support a reduced cycle time so some method of keeping them unchanged in the new technology is desired.

Therefore, it has become quite important to find ways to ensure the scalability of these critical types of circuits. Current practice and state of the art has not afforded such a method, other than extremely expensive methods of fabricating multiple technologies on a chip, such as bipolar circuits plus Complementary Metal Oxide Semiconductor (CMOS) where the bipolar circuits could be used for analog circuits and be kept the same when the performance of the digital CMOS circuits are improved. However for reasons of manufacturing cost and power efficiency, it is desirable to fabricate all of the analog and digital circuits in the same technology, usually preferably in CMOS.

SUMMARY OF THE INVENTION

In view of the above, it would be beneficial to have an improved system and method for ensuring migratability of circuits into future technologies while minimizing fabrication costs and maintaining or improving power efficiency. Thus it would be beneficial to have a system and method that permits the beta ratio for certain analog and digital circuits to be kept the same, and the performance/functionality may be kept the same, while the speed of the rest of the circuitry on the chip is increased with improvements to the circuitry.

The present invention provides a system and method for ensuring the migratability of circuits into future technologies while minimizing fabrication costs and maintaining or improving power efficiency. With the present invention, a mask layer is introduced to portions of the integrated circuit, e.g., critical transistors, prior to a stress inducing layer being applied to the integrated circuit. This in effect shields the portions of the integrated circuit to which the mask layer is applied from the affects of the stress inducing layer.

In an exemplary embodiment of the present invention, a tensile or compressive film is applied to the devices on the integrated circuit chip but is removed from those devices whose operation is to be modified. Thereafter, a tensile or compressive strain layer is applied to the devices whose film was removed. An additional mask layer may then be used to effect a halo or well implant to relax the strain on the devices not being protected by the mask layer. In this way, the current of the non-protected devices is reduced back to its original target design point.

In another exemplary embodiment of the present invention, prior to applying a tensile or compressive stress layer to the devices of an integrated circuit to improve the devices' current, a mask layer is applied to portions of the integrated circuit which blocks off the tensile or compressive stress layer. This mask layer blocks the surface of the integrated circuit in the area to which the mask layer is applied such that the stress in the integrated circuit is kept at what is found in the original technology, i.e. the integrated circuit prior to application of the tensile or compressive stress layer.

In yet a further embodiment of the present invention, the mask layer of the present invention is used to provide a voltage (Vt) implant mechanism. In other words, a compressive stress layer is applied to all of the pFET CMOS devices in the design. A design masking layer may then be used to expose only those critical devices whose operation is desired to remain unchanged from the previous technology. This masking layer may then be used to implant a dopant which modifies the voltage (Vt) at which the critical devices operate. By careful selection of the amount by which the Vt is shifted up or down the device speed and current may be tailored to match that of the original technology at a specific point in the process window.

In one exemplary embodiment of the present invention, a system, method and computer program product are provided in which a first, second and third type of integrated circuit element are identified. The first type of integrated circuit element is one in which the operational characteristics of the first type of integrated circuit element are to be modified. The third type of integrated circuit element is one in which the operational characteristics of the third type of integrated circuit element are to be modified also. The second type of integrated circuit element is one in which the operational characteristics of the second type of integrated circuit element are to remain constant.

A first stress inducing film is deposited on the first type of integrated circuit element. The first stress inducing film applies a first stress to the first type of integrated circuit element to thereby change an operational characteristics of the first type of integrated circuit element. A second stress inducing film is deposited on the third type of integrated circuit element. The second stress inducing film induces a second stress to the third type of integrated circuit element to thereby change an operational characteristic of the third type of integrated circuit element. In one exemplary embodiment of the present invention, the first stress inducing film is a compressive stress inducing film and the second stress inducing film is a tensile stress inducing film.

In one exemplary embodiment of the present invention, the first type of integrated circuit element is a nFET device whose operation is to be modified. The second type of integrated circuit element is a pFET device show operation is not to be modified. The third type of integrated circuit element is a pFET device whose operation is to be modified.

In one exemplary embodiment, the depositing of a first stress inducing film on the first type of integrated circuit element may comprise depositing the first stress inducing film on the first, second and third type of integrated circuit element. The first stress inducing film may then be stripped from the third type of integrated circuit element. A first masking layer may be applied to the first and second type of integrated circuit elements prior to stripping the first stress inducing film from the third type of integrated circuit element. The first masking layer may be a combination of a first mask associated with the first type of integrated circuit element and a second mask associated with the second type of integrated circuit element.

In a further embodiment of the present invention, the first masking layer may be applied to the first and second type of integrated circuit elements and the second stress inducing film may be applied to the first, second and third type of integrated circuit elements. The first masking layer and second stress inducing film may then be stripped from the first and second type of integrated circuit elements.

In addition, the operations described above may further include relaxing a surface of the second type of integrated circuit element so as to relax the first stress applied to the second type of integrated circuit element. The relaxing of the first stress applied to the second type of integrated circuit element causes the operational characteristics of the second type of integrated circuit element to be substantially unchanged. This relaxation of the surface of the second type of integrated circuit element may be performed using ion implantation, for example. This operation may include masking the first type of integrated circuit element using a first mask, masking the third type of integrated circuit element using a second mask, and then performing ion implantation to the second type of integrated circuit device based on the design masking layer.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 2 is an exemplary diagram illustrating standard CMOS elements prior to application of the mechanisms of the exemplary embodiments of the present invention;

FIG. 3 is an exemplary diagram illustrating a deposition of a tensile nFET film on the CMOS elements shown in FIG. 2 in accordance with an exemplary embodiment of the present invention;

FIG. 4 is an exemplary diagram illustrating the removal of the tensile nFET film from the standard pFET of the CMOS elements shown in FIG. 3 in accordance with an exemplary embodiment of the present invention;

DETAILED DESCRIPTION OF THE PREFERRED EMBODIMENT

As mentioned above, the present invention is directed to a system and method for masking a portion of a circuit while improvements are made to other portions of the circuit so that existing circuits may be migrated to new technologies. The present invention is preferably implemented in a data processing system that is used to control the fabrication and/or modification of integrated circuits using masking layers, deposition, ion implantation, and the like.

Figure 1:
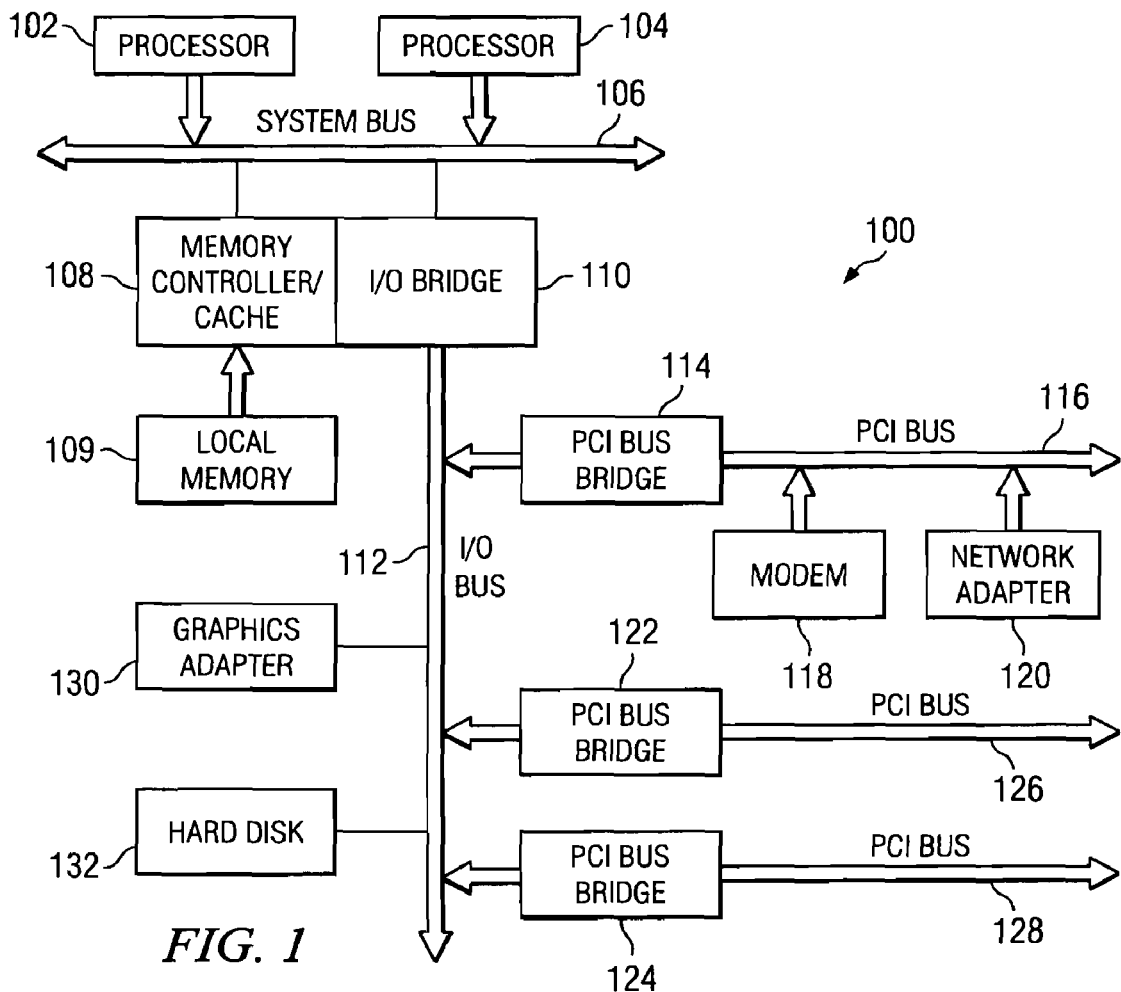
FIG. 1 is an exemplary diagram illustrating a data processing system in which the exemplary aspects of the present invention may be implemented for controlling the fabrication and/or modification of elements on an integrated circuit.

FIG. 1 is an exemplary diagram illustrating a data processing system in which the exemplary aspects of the present invention may be implemented for controlling the fabrication and/or modification of elements on an integrated circuit. Data processing system 100 may be a symmetric multiprocessor (SMP) system including a plurality of processors 102 and 104 connected to system bus 106. Alternatively, a single processor system may be employed. Also connected to system bus 106 is memory controller/cache 108, which provides an interface to local memory 109. I/O Bus Bridge 110 is connected to system bus 106 and provides an interface to I/O bus 112. Memory controller/cache 108 and I/O Bus Bridge 110 may be integrated as depicted.

Peripheral component interconnect (PCI) bus bridge 114 connected to I/O bus 112 provides an interface to PCI local bus 116. A number of modems may be connected to PCI local bus 116. Typical PCI bus implementations will support four PCI expansion slots or add-in connectors. Communications links to other computing devices may be provided through modem 118 and network adapter 120 connected to PCI local bus 116 through add-in connectors.

Additional PCI bus bridges 122 and 124 provide interfaces for additional PCI local buses 126 and 128, from which additional modems or network adapters may be supported. In this manner, data processing system 100 allows connections to multiple network computers. A memory-mapped graphics adapter 130 and hard disk 132 may also be connected to I/O bus 112 as depicted, either directly or indirectly.

Those of ordinary skill in the art will appreciate that the hardware depicted in FIG. 1 may vary. For example, other peripheral devices, such as optical disk drives and the like, also may be used in addition to or in place of the hardware depicted. The depicted example is not meant to imply architectural limitations with respect to the present invention. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

A data processing system, such as the exemplary data processing system shown in FIG. 1, is used to control the fabrication and/or modification of elements of an integrated circuit in accordance with the processes described hereafter. The data processing system may interface with integrated circuit fabrication machinery in order to control this machinery to perform the various process steps that will be described hereafter. The use of data processing devices, programmed by computer software, to control integrated circuit fabrication is generally known in the art and thus, a detailed description of the way in which the fabrication machinery operates is not included herein. The following description is provided to detail the various processes performed in order to achieve the purposes of the present invention.

FIG. 2 is an exemplary diagram illustrating standard CMOS elements prior to application of the mechanisms of the exemplary embodiments of the present invention. In the examples shown in FIGS. 2-6, it is assumed that advances in technology require that certain pFET devices have their operation modified to achieve higher speed or frequency operation. The mechanisms of the present invention, however, may be used to modify any type of integrated circuit element independently of other elements on the integrated circuit. Thus, for example, the mechanisms of the present invention may be used to modify certain nFET devices while keeping the operation of other nFET and/or pFET devices the same.

As shown in FIG. 2, typical integrated circuits may include nFET CMOS devices 210 and pFET CMOS devices 220-230. After fabrication of the integrated circuit, or during fabrication of an integrated circuit using an older design, advances in technology may require that certain elements of the integrated circuit have their performance modified while other elements of the integrated circuit remain the same. For example, some of the nFET and pFET devices, e.g., nFET device 210 and pFET device 220, may operate at a sufficient speed or frequency while other pFET CMOS devices, e.g., pFET device 230, need to be modified to achieve a different speed or frequency of operation. Further, a speed up of the circuit comprising devices 210 and 220 may actually cause it to slow down or even no longer function. The pFET devices 220 whose operation is sufficient for the new technology and which are not to be subjected to the effects of a strain layer to achieve higher currents are referred to herein as "migrated pFETs."

The present invention provides a mechanism for modifying the operation of certain elements of the integrated circuit while other elements are maintained at their current operational state. The need for such a mechanism is felt in a number of situations. For example, such a situation may occur in a large processor where it is determined that N-transistor performance will likely stay the same in future versions of the fabrication technology, however it may be anticipated that improvements to the P-transistors could be offered at a later date. As another example, it may be determined that certain phase locked loops (PLLs) may operate at sufficient VCO frequencies which may be many times faster than the actual clock frequency of the integrated circuit. However, other elements of the integrated circuit may need to have their operation modified to achieve greater frequencies.

In the depicted example, it is assumed that the nFET device 210 and pFET device 220 are operating at a sufficient speed and frequency for migration to a new technology and modification of the beta ratio may cause them to function less effectively or not to function at all. The pFET device 230 needs to have its operation modified for the new technology. With these assumptions, as shown in FIGS. 3-6 hereafter, the present invention provides an additional mask for permitting the relaxation of the pFET device 220 so that its operation is maintained as it was prior to application of compressive/tensile strain layers. FIGS. 2-6 illustrate a process by which elements of an integrated circuit may have their operation modified while other elements are permitted to maintain their original operational characteristics.

FIG. 3 is an exemplary diagram illustrating a deposition of a tensile nFET film on the CMOS elements shown in FIG. 2 in accordance with an exemplary embodiment of the present invention. As shown in FIG. 3, after standard CMOS device fabrication (FIG. 2), a tensile nFET film 310 is applied to all three elements 210-230. As will be shown hereafter, the tensile nFET film 310 is used to apply tensile stress to obtain better current properties for transistor elements.

Initially, the nFET film 310 is applied to all of the elements 210, 220 and 230. Subsequently, as will be described hereafter, the nFET film 310 is removed from those elements of the integrated circuit design that are not migratable. That is, a first design masking layer that identifies nFET elements of the integrated circuit design is combined with a second design masking layer that identifies the migratable pFET elements of the integrated circuit design to thereby generate a combined design masking layer, referred to herein as the "OW" masking layer. The term "design" masking layer is intended to refer to a virtual masking layer represented in a computer generated design of an integrated circuit, rather than an actual physical layer that is applied to the integrated circuit device itself.

The first and second design masking layers are essentially "OR'd" with each other when determining which elements of the integrated circuit design are to have the nFET film 310 removed from them. As a result, only those elements that do not have one of the design masking layers associated with them will have the nFET film 310 removed. This operation will be described in greater detail hereafter.

In this way, the tensile nFET film 310 is left only over the nFET elements and the migratable pFET elements. The tensile nFET film 310 is applied to the migratable pFET elements as an etch-stopping layer for later steps in the fabrication process. Because the nFET film 310 applies a tensile stress to the migratable pFET elements, this tensile stress needs to be relaxed, such as by an ion implantation operation, as will be described hereafter. It is possible to use a neutral layer rather than a tensile stress inducing layer over the migratable pFET elements, however this introduces additional complexity to the fabrication process and it is simpler to have the same tensile nFET film 310 applied to all of the elements in one fabrication step.

It should be appreciated that while FIG. 3 illustrates the application of a tensile nFET film 310, a compressive film may be used instead depending on the particular elements whose operation is being modified and the particular elements whose operation is intended to be maintained during a migration process in accordance with the present invention.

FIG. 4 is an exemplary diagram illustrating the removal of the tensile nFET film from the standard pFET of the CMOS elements shown in FIG. 3 in accordance with an exemplary embodiment of the present invention. As shown in FIG. 4, after application of the tensile nFET film 310, this film 310 is removed from the pFETs that are to have their operation modified for use with the new technology, e.g., pFET 230. The elements that are to have the nFET film 310 removed are identified in a design masking layer, that is a combination of a design masking layer associated with nFET devices and a design masking layer associated with migratable pFET devices, as shapes within the design masking layer, i.e. openings in the OW masking layer. In this way, the design masking layer covers those elements on the integrated circuit whose operation is not to be modified, but leaves openings, or shapes, over those elements that are to have their operation modified by application of a stress inducing layer.

As shown in FIG. 4, the removal of the nFET tensile film 310 is performed by applying a design masking layer 410 which protects the pFET 220 and nFET 210 whose operation is not intended to change. The design masking layer 410 is generated as the Boolean OR of a first design mask layer 420 for masking the nFET elements 210 and an additional design mask layer 430 provided by the present invention, which identifies those pFET elements 220 which are to be migrated. The additional design mask layer 430 leaves openings over those pFET elements whose operation is to be modified by application of a stress inducing layer, e.g., pFET element 230.

The intersection of these two design mask layers 420 and 430 results in a combined design masking layer 410 that is applied to both the nFETs 210 and the migrated pFETS 220, but is not applied to pFETs 230 whose operation is to be modified. The stripping of the film 310 from pFET 230 based on the combined design masking layer 410, hereafter referred to as the "OW" masking layer, may be performed in any known manner for stripping layers during an integrated circuit fabrication process. For example, the stripping of layers may be performed by depositing a physical masking layer over those elements that are not to have their layer removed, e.g., those elements masked by design masking layer 410, and then applying an etching solution to remove the physical masking layer from those elements as well as the layer that is to be removed from those elements that did not have the physical masking layer applied. Alternatively, a physical mask may be applied to those elements that are not masked by design masking layer 410, the film 310 may be applied to all of the elements 210-230, and then removed along with the physical masking layer from those elements that are not masked by the design masking layer 410. Such a process for removal of layers is generally known in the art.

The additional design mask layer 430 may be generated in a number of different ways based on engineering judgment. For example, the additional design mask layer 430 may be generated based on simulations of a new technology with which an integrated circuit design is to be operated. The simulation provides information for determining if current technology is fast enough to operate with this new technology and whether getting higher current is going to cause problems in the operation of current technology. Based on such information, particular types of pFET or nFET devices may be identified as devices whose operation may be migratable to the new technology and devices whose operation must be modified so as to work with the new technology. The generation of design mask layers based on these identified types of pFET and nFET devices may the be performed in a straightforward manner.

Figure 5:
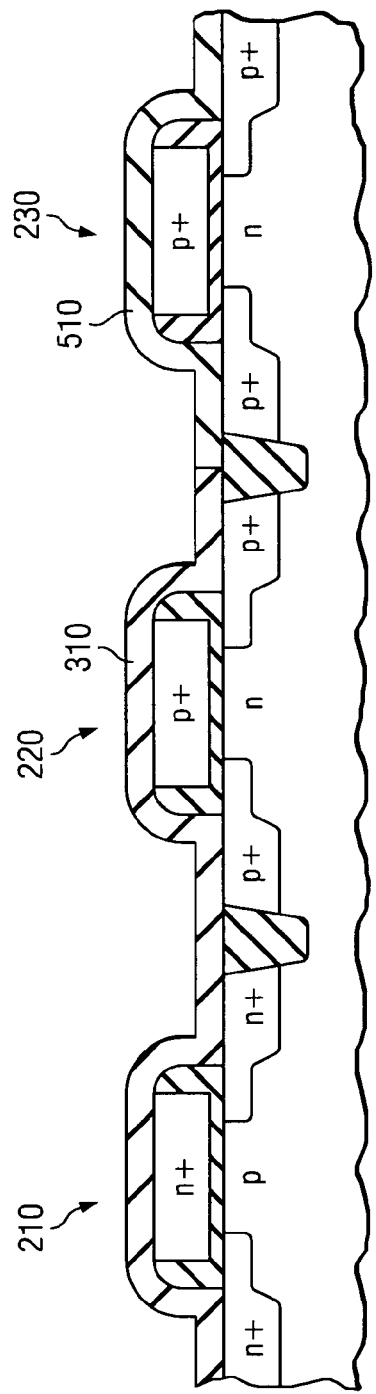
FIG. 5 is an exemplary diagram illustrating deposition of a compressive film on the standard pFET of the CMOS elements shown in FIG. 4 in accordance with an exemplary embodiment of the present invention.

FIG. 5 is an exemplary diagram illustrating deposition of a compressive film on the standard pFET of the CMOS elements shown in FIG. 4 in accordance with an exemplary embodiment of the present invention. As shown in FIG. 5, following stripping of the nFET film 310 from the pFET 230, a compressive film 510 is applied to the pFET 230. Again, this process may make use of the OW mask 410 to protect the elements 210 and 220 from the application of the compressive film 510. That is, for example, a physical masking layer may be applied to elements 210 and 220 prior to the application of the compressive film 510 to all of the elements 210-230. Thereafter, the physical masking layer may be removed from elements 210 and 220, thereby removing the compressive film 510 from these elements as well. As a result, the compressive film 510 is only applied to pFET 230 while the nFET 210 and pFET 220 are immune to the effects of the compressive film 510.

The compressive film induces a compressive stress on the pFET 230 which tends to increase the currents of the transistor and thus, the frequency or speed of operation of the transistor. Alternatively, rather than applying a compressive film 510, depending upon the particular elements whose operation is being modified, a tensile stress inducing layer may be applied at this point in the fabrication process. The use of compressive and tensile films to change the operation of integrated circuit elements is generally known in the art. For example, U.S. Pat. No. 6,621,131 issued to Murthy et al. on Sep. 16, 2003, which is hereby incorporated by reference, describes a method for fabricating a PMOS semiconductor transistor in which a germanium alloy layer is used to induce a compressive stress on the transistor because of the spacing of the lattice in the germanium alloy.

Figure 6:
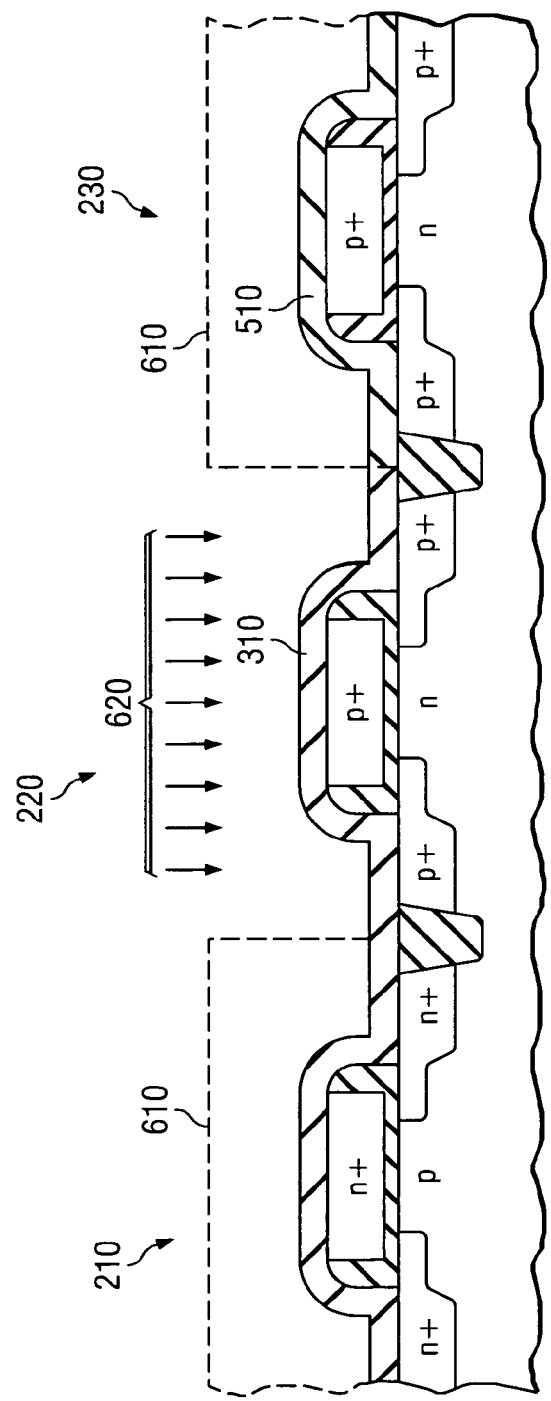
FIG. 6 is an exemplary diagram illustrating selective relaxation of tensile stress over a migrated pFET region of the CMOS elements shown in FIG. 5 in accordance with an exemplary embodiment of the present invention.

FIG. 6 is an exemplary diagram illustrating selective relaxation of tensile stress over a migrated pFET region 220 of the CMOS elements shown in FIG. 5 in accordance with an exemplary embodiment of the present invention. As shown in FIG. 5, after application of the compressive film 510 to the pFET 230, the additional design mask layer 430 is used to identify those pFETs 220 that are to be migrated. A design masking layer 610, consisting of the nFET design masking layer 420, and a new design masking layer consisting of the shapes over the pFETs whose operation was modified by application of the layer 510, is applied to the integrated circuit design to thereby control ion implantation. As a result, an opening 620 in the OW masking layer 610 is generated. This opening 620, or "halo," provides a channel for relaxing the tensile stress over the migrated pFET 220. This relaxation may be performed, for example, by using ion implantation (denoted by the arrows pointing into opening 620) or another known relaxation technique.

As a result of the above fabrication process, the pFET 220 is migrated for use with a new technology, i.e. its operation is kept the same as in the original pFET 220. The pFET 230 has its operation modified by the application of the stress inducing layer, e.g., compressive film 510, such that the pFET 230 operates at a different speed or frequency. The nFET 210 has its operation modified by the application of a tensile film so that the nFET 210 operates at a different speed or frequency. Through the mechanisms of the present invention, some elements 210 and 230 of the integrated circuit have their operation modified while other elements 220 are permitted to continue operation without modification.

It should be appreciated that FIGS. 2-6 are only illustrative of one exemplary embodiment of the present invention and modifications to the fabrication steps shown in FIGS. 2-6 may be made without departing from the spirit and scope of the present invention. For example, in some implementations of the present invention, it may not be necessary to apply a tensile nFET film 310 to the elements 210-230. In such an implementation, it would not be necessary to remove the tensile nFET film 310 from the element 230 as shown in FIG. 4. Rather, the nFET design masking layer 420 may be used to cause the compressive film 510 to be applied to both the pFET 220 and the pFET 230. The relaxation step may then be used to relax the compressive stress induced by the compressive film on pFET 220.

It should also be appreciated that the relaxation step shown in FIG. 6 may be performed at any of a number of points in the fabrication process shown in FIGS. 2-6. For example, the relaxation step shown in FIG. 6 may be performed after the deposition of the tensile nFET film 310, after stripping of the tensile nFET film 310 from the pFET 230, or after application of the compressive film 510.

The embodiment described above is used to create an opening over, or "halo" around, the transistor elements that are to be migrated to the new technology such that the migrated transistor elements may be relaxed back to an original operational state. In an alternative embodiment, the OW masking layer of the present invention may be used to completely block the application of a stress inducing layer from affecting transistor elements that are to be migrated. That is, prior to applying a tensile or compressive stress layer to the transistor devices of an integrated circuit to improve the transistor devices' current, the nFET design mask layer 420 and/or OW masking layer 410 are used to apply a design masking layer to portions of the integrated circuit which blocks off both the tensile and the compressive stress layer. This design masking layer blocks the surface of the integrated circuit in the area to which the design masking layer is applied such that the stress in the integrated circuit is kept at what is found in the original technology, i.e. the integrated circuit prior to application of the tensile or compressive stress layer. Those areas of the integrated circuit that are not masked by the nFET and/or OW masking layers have the stress inducing layer applied to them such that their operational characteristics are modified.

Using either embodiment of the present invention results in an integrated circuit in which some elements of the integrated circuit have their operation modified while other elements of the integrated circuit have their operational characteristics maintained as they originally were. In this way, the operational characteristics of portions of an integrated circuit may be modified for use with new technologies while other portions that were originally designed with sufficient operational ability for the new technology may remain unchanged.

In a further embodiment of the present invention, the combined design masking layer of the present invention is used to provide a voltage (Vt) implant mechanism. In other words, a compressive stress layer is applied to all of the pFET CMOS devices in the design. A design masking layer may then be used to expose only those critical devices whose operation is desired to remain unchanged from the previous technology. This masking layer may then be used to implant a dopant which modifies the voltage (Vt) at which the critical devices operate. By careful selection of the amount by which the Vt is shifted up or down the device speed and current may be tailored to match that of the original technology at a specific point in the process window.

Figure 7:
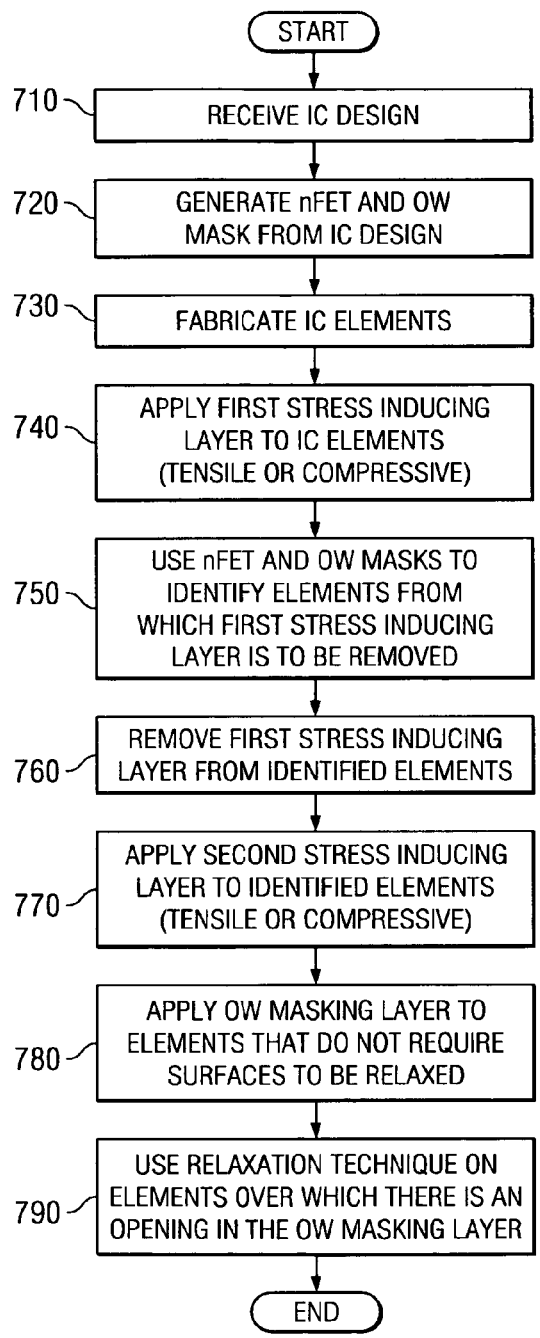
FIG. 7 is a flowchart outlining an exemplary operation of the present invention when using an OW mask to develop openings over elements that are to be migrated.
Figure 8:
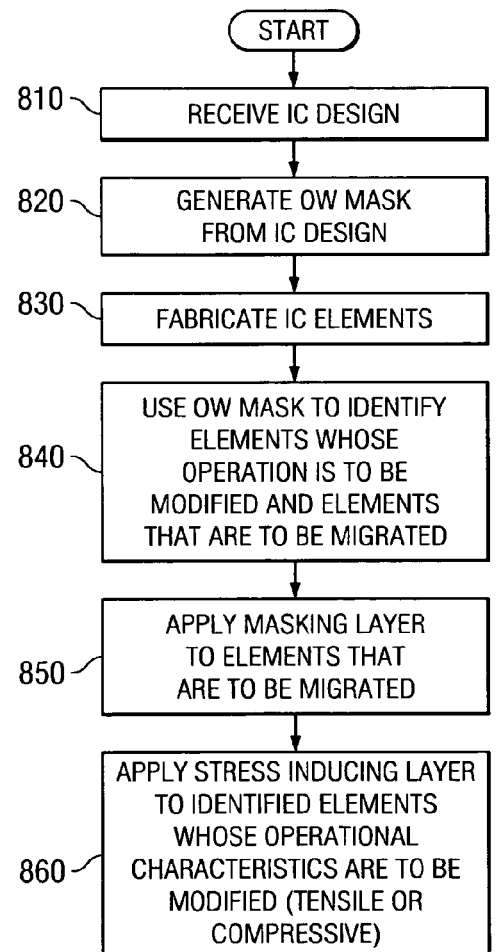
FIG. 8 is a flowchart outlining an exemplary operation of the present invention when using an OW mask to block all elements whose operation is not to be modified by the application of a stress inducing layer.

FIGS. 7 and 8 are flowcharts outlining exemplary operations of the present invention. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

FIG. 7 is a flowchart outlining an exemplary operation of the present invention when using an OW mask to develop openings over elements that are to be migrated. As shown in FIG. 7, the operation starts by receiving an integrated circuit design (step 710). A nFET mask and OW mask are determined from the integrated circuit design (step 720). The nFET mask and OW mask may be generated, for example, by identifying those pFET and nFET devices in the original integrated circuit design that are to have their operational characteristics modified by applying stress inducing layers, and those pFET and nFET devices whose operation is intended to remain constant. The determination as to which devices are to have their operational characteristics modified and which devices are to remain constant may be performed manually by an engineer or through some automatic mechanism, such as using a simulation of new technology to determine the operational characteristics of the new technology and matching those operational characteristics to a simulation of the integrated circuit design to see which elements may already operate as sufficient levels.

The integrated circuit elements are then fabricated using a standard CMOS device fabrication mechanism (step 730). Alternatively, the integrated circuit elements may have already been fabricated and the mechanisms of the present invention may be applied to a previously fabricated integrated circuit device to thereby modify the operation of the integrated circuit device. For purposes of explanation, it will be assumed that the integrated circuit device is being fabricated using the mechanisms of the present invention to modify the operation of some of the integrated circuit elements that are being fabricated.

A first stress inducing layer is applied to the integrated circuit elements (step 740). The nFET and OW masks are used to identify elements from which the first stress inducing layer is to be removed (step 750). The first stress inducing layer is removed from the identified elements (step 760) and a second stress inducing layer is applied to these identified elements (step 770). The OW mask is then used to apply a masking layer to elements that are not to have their surfaces relaxed (step 780). Those elements over which there is an opening in the masking layer are then relaxed using a known relaxation technique, e.g., ion implantation (step 790). The operation then terminates.

FIG. 8 is a flowchart outlining an exemplary operation of the present invention when using an OW mask to block all elements whose operation is not to be modified by the application of a stress inducing layer. As shown in FIG. 8, the operation starts by receiving an integrated circuit design (step 810). An OW mask is determined from the integrated circuit design (step 820). The integrated circuit elements are then fabricated using a standard CMOS device fabrication mechanism (step 830). The OW mask is then used to identify those elements of the integrated circuit whose operation is to be modified and those elements whose operation is to be migrated (step 840). A masking layer is then applied to those elements whose operation is to be migrated (step 850). A stress inducing layer is then applied to the elements such that those elements that do not have the masking layer applied to them have their operational characteristics modified by the stress inducing layer (step 860). The operation then terminates.

Thus, the present invention provides a system and method for ensuring the migratability of circuits into future technologies while minimizing fabrication costs and maintaining or improving power efficiency. With the present invention, a masking layer is introduced to portions of the integrated circuit, e.g., critical transistors, prior to a stress inducing layer being applied to the integrated circuit. This in effect shields the portions of the integrated circuit to which the mask layer is applied from the affects of the stress inducing layer. In addition, the masking layer of the present invention may be used to perform relaxation of certain elements to ensure that any effects of a stress inducing layer applied to them are negated.

The mechanism as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer program product comprising a computer usable medium having a computer readable program, wherein the computer readable program, when executed on a computing device, causes the computing device to:
   identify a first type of integrated circuit element, a second type of integrated circuit element and a third type of integrated circuit element, wherein operational characteristics of the first type of integrated circuit element are to be modified, operational characteristics of the third type of integrated circuit element are to be modified, and operational characteristics of the second type of integrated circuit element are to remain constant;
   control depositing of a first stress inducing film on the first, second and third type of integrated circuit element;
   control applying a first masking layer to the first and second type of integrated circuit elements;
   control stripping of the first stress inducing film from the third type of integrated circuit element, wherein the first masking layer is applied prior to stripping the first stress inducing film from the third type of integrated circuit element, and wherein the first stress inducing film applies a first stress to the first type of integrated circuit element to thereby change an operational characteristic of the first type of integrated circuit element; and
   control depositing of a second stress inducing film on the third type of integrated circuit element, wherein the second stress inducing film induces a second stress to the third type of integrated circuit element to thereby change an operational characteristic of the third type of integrated circuit element.

2. The computer program product of claim 1, wherein the first type of integrated circuit element is a nFET device whose operation is to be modified, the second type of integrated circuit element is a pFET device whose operation is not to be modified, and the third type of integrated circuit element is a pFET device whose operation is to be modified.

3. The computer program product of claim 1, wherein the computer readable program further controls relaxing of a surface of the second type of integrated circuit element so as to relax the first stress applied to the second type of integrated circuit element, wherein the relaxing of the first stress applied to the second type of integrated circuit element causes the operational characteristics of the second type of integrated circuit element to be substantially unchanged.

4. The computer program product of claim 3, wherein the surface of the second type of integrated circuit element is relaxed by performing ion implantation.

5. The computer program product of claim 1, wherein the first stress inducing film is a compressive stress inducing film and the second stress inducing film is a tensile stress inducing film.

6. The computer program product of claim 1, wherein the computer readable program further controls:
   applying the second stress inducing film to the first, second and third type of integrated circuit elements; and
   stripping the first masking layer and the second stress inducing film from the first and second type of integrated circuit elements.

7. An integrated circuit device, comprising:
   a first type of integrated circuit element whose operational characteristics are modified from original operational characteristics of the first type of integrated circuit by way of application of a first stress inducing film;
   a second type of integrated circuit element whose operational characteristics remain constant with respect to original operational characteristics of the second type of integrated circuit elements;
   a third type of integrated circuit element, different from the first type of integrated circuit element, whose operational characteristics are modified from original operational characteristics of the third type of integrated circuit by way of application of a second stress inducing film;
   a first stress inducing film applied to the first, second and third type of integrated circuit element, and being stripped from the third type of integrated circuit element after applying a first masking film to the first and second type of integrated circuit element, wherein the first stress inducing film applies a first stress to the first type of integrated circuit element to thereby change an operational characteristic of the first type of integrated circuit element; and
   a second stress inducing film deposited on the third type of integrated circuit element, wherein the second stress inducing film induces a second stress to the third type of integrated circuit element to thereby change an operational characteristic of the third type of integrated circuit element.

8. The computer program product of claim 1, wherein the first type of integrated circuit element is a nFET device whose operation is modified from an original operation of the nFET device, the second type of integrated circuit element is a pFET device whose operation remains constant with respect to an original operation of the pFET device, and the third type of integrated circuit element is a pFET device whose operation is modified from an original operation of the pFET device.

9. The computer program product of claim 1, wherein the first masking layer is a combination of a first mask associated with the first type of integrated circuit element and a second mask associated with the second type of integrated circuit element.

10. The computer program product of claim 3, wherein the computer readable program further controls relaxing the surface of the second type of integrated circuit element by:
    masking the first type of integrated circuit element using a first mask;
    masking the third type of integrated circuit element using a second mask; and
    performing ion implantation to the second type of integrated circuit device based on the design masking layer.

* * * * *